United States Patent
Iwabuchi (10) Patent No.: US 7,132,725 B2
(45) Date of Patent: Nov. 7, 2006

(54) SEMICONDUCTOR DEVICE

(75) Inventor: Akio Iwabuchi, Saitama (JP)

(73) Assignee: Sanken Electric Co., Ltd., Saitama (JP)

( * ) Notice: Subject to any disclaimer, the term of this patent is extended or adjusted under 35 U.S.C. 154(b) by 0 days.

(21) Appl. No.: 10/504,891

(22) PCT Filed: Feb. 24, 2003

(86) PCT No.: PCT/JP03/01982

§ 371 (c)(1),
(2), (4) Date: Aug. 18, 2004

(87) PCT Pub. No.: WO03/075353

PCT Pub. Date: Sep. 12, 2003

(65) Prior Publication Data

US 2005/0104124 A1    May 19, 2005

(30) Foreign Application Priority Data

Mar. 1, 2002    (JP)    ................... 2002-056566

(51) Int. Cl.
*H01L 29/72* (2006.01)

(52) U.S. Cl. .............. 257/492; 257/493; 257/341; 257/409

(58) Field of Classification Search ........... 257/341, 257/492, 493
See application file for complete search history.

(56) References Cited

U.S. PATENT DOCUMENTS 5,428,241 A * 6/1995 Terashima .............. 257/409
5,852,314 A   12/1998 Depetro et al.
5,861,657 A   1/1999 Ranjan

* cited by examiner

*Primary Examiner*—Edward Wojciechowicz
(74) *Attorney, Agent, or Firm*—Howard & Howard Attorneys, P.C.

(57) ABSTRACT

A p-channel MOSFET 1 has a buried layer 9 between a substrate 2 and an epitaxial layer 3. The impurity concentration of the buried layer 9 is higher than that of the epitaxial layer 3. As a result, if the p-channel MOSFET 3 and an n-channel MOSFET are fabricated in a single semiconductor substrate and when a voltage is applied between the source electrode 13 and the drain electrode 12, the impurity concentration of the epitaxial layer 3 apparently increases. Thus, the charge balance of the p-channel MOSFET 1 is not lost.

11 Claims, 3 Drawing Sheets

SEMICONDUCTOR DEVICE

TECHNICAL FIELD

The present invention relates to a semiconductor device, and, specifically, to a semiconductor device having a so-called double RESURF structure.

BACKGROUND ART

There is known a high withstand voltage IC (Integrated Circuit) comprising a plurality of semiconductor devices formed on a common semiconductor substrate, such as a p-channel MOSFET (Metal Oxide Semiconductor Field Effect Transistor) and an n-channel MOSFET.

Figure 5:
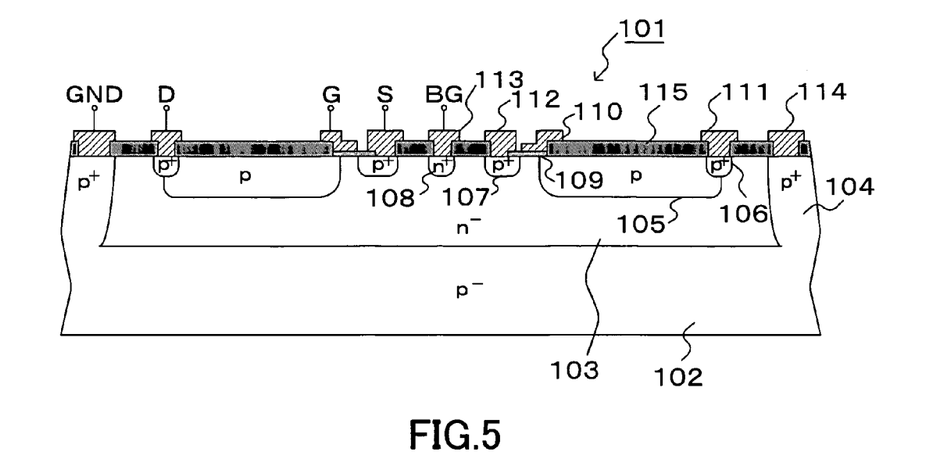
FIG. 5 is a cross-sectional view of a conventional p-channel MOSFET.
Figure 6:
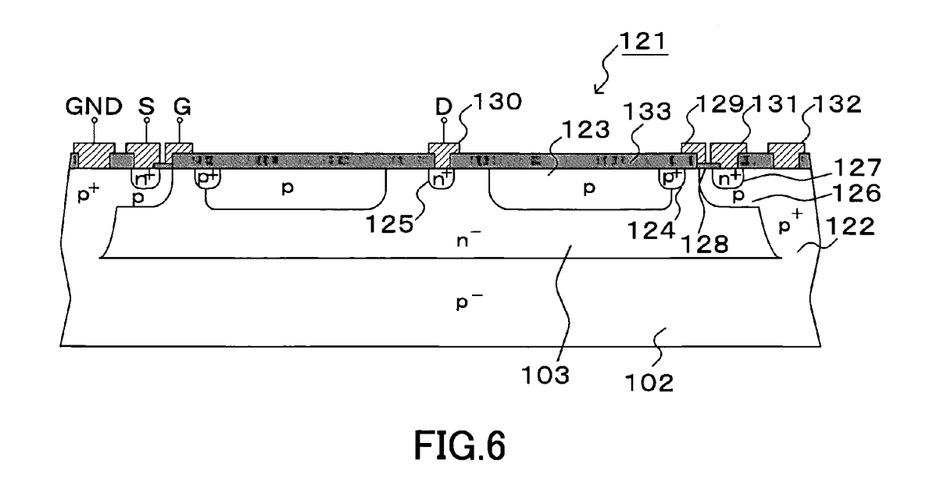
FIG. 6 is a cross-sectional view of a conventional n-channel MOSFET.

FIG. 5 shows a p-channel MOSFET which constitutes a high withstand voltage IC and FIG. 6 shows an n-channel MOSFET which constitutes a high withstand voltage IC.

As shown in FIG. 5, a p-channel MOSFET 101 includes a p$^-$-type semiconductor substrate 102, an n$^-$-type epitaxial layer 103, a p$^+$-type diffusion isolation layer 104, a p-type diffusion region 105, a p$^+$-type drain contact region 106, a p$^+$-type source region 107 and an n$^+$-type back gate region 108.

The epitaxial layer 103 is formed on the semiconductor substrate 102. The diffusion isolation layer 104 electrically isolates the p-channel MOSFET 101 from other semiconductor devices (e.g., an n-channel MOSFET) by pn junction isolation. The diffusion region 105 is formed at the surface of the epitaxial layer 103 by impurity diffusion. The drain contact region 106 is formed, adjacent to the diffusion region 105, at the surface of the epitaxial layer 103. The source region 107 is formed at the surface of the epitaxial layer 103 with a predetermined distance apart from the diffusion region 105. The back gate region 108 is formed near the source region 107 at the surface of the epitaxial layer 103.

The surface region of the epitaxial layer 103 which lies between the diffusion region 105 and the source region 107 functions as a channel region. A gate electrode 110 is formed at the top surface of the channel region via a gate oxide layer 109. A drain electrode 111 is formed at the top surface of the drain contact region 106, a source electrode 112 is formed at the top surface of the source region 107, a back gate electrode 113 is formed at the top surface of the back gate region 108, and a ground electrode 114 is formed at the top surface of the diffusion isolation layer 104. The electrodes 111, 112, 113 and 114 are electrically connected to the regions 106, 107, 108 and 104, respectively. A field oxide film 115 formed on the diffusion region 105.

As shown in FIG. 6, an n-channel MOSFET 121 includes the semiconductor substrate 102 and the epitaxial layer 103, which are common to the p-channel MOSFET 101, a p$^+$-type diffusion isolation layer 122, a p-type diffusion region 123, a p$^+$-type diffusion region 124, an n$^+$-type drain contact region 125, a p-type diffusion region 126, and an n$^+$-type source region 127.

The diffusion isolation layer 122 electrically isolates the n-channel MOSFET 121 from other semiconductor devices (e.g., a p-channel MOSFET) by pn junction isolation. The diffusion region 123 is formed at the surface of the epitaxial layer 103 by impurity diffusion. The diffusion region 124 is formed, adjacent to the diffusion region 123, at the surface of the epitaxial layer 103. The drain contact region 125 is formed at the surface of the epitaxial layer 103 with a predetermined distance apart from the diffusion region 123. The diffusion region 126 is formed adjacent to the diffusion isolation layer 122. The source region 127 is formed at the surface of the diffusion region 126.

The surface region of the diffusion region 126 which lies between the epitaxial layer 103 and the source region 127 functions as a channel region. A gate electrode 129 is formed at the top surface of the channel region via a gate oxide layer 128. A drain electrode 130 is formed at the top surface of the drain contact region 125, a source electrode 131 is formed at the top surface of the source region 127, and a ground electrode 132 is formed at the top surface of the diffusion isolation layer 122. The electrodes 130, 131 and 132 are electrically connected to the regions 125, 127 and 122, respectively. A field oxide film 133 formed on the diffusion region 123.

As described above, the p-channel MOSFET 101 and the n-channel MOSFET 121 are both have a so-called double RESURF structure where the n$^-$-type epitaxial layer 103 is formed on the p$^-$-type semiconductor substrate 102 and the p-type diffusion region 105, 123 is formed at the surface of the n$^-$-type epitaxial layer 103.

As a voltage is applied between the source electrode 112, 131 and the drain electrode 111, 130, a depletion layer extends from each of a pn junction formed at the interface between the semiconductor substrate 102 and the epitaxial layer 103 and a pn junction formed at the interface between the epitaxial layer 103 and the diffusion region 105, 123.

When the applied voltage reaches a predetermined voltage value, the depletion layers that extend from the two pn junctions are connected together. Accordingly, the depletion layer extends substantially all over the epitaxial layer 103 and the diffusion region 105, 123, thus fixing the potential. As a result, the electric field is relaxed well so that the MOSFET 101, 121 having a high withstand voltage is realized.

To provide a good electric-field relaxing effect in the MOSFET 101, 121 having a double RESURF structure, it is necessary to properly keep the charge balance among the semiconductor substrate 102, the epitaxial layer 103 and the diffusion region 105, 123.

To properly keep the charge balance, it is preferable that when the voltage between the source electrode 112, 131 and the drain electrode 111, 130 reaches the predetermined voltage value, the difference between the total amount of negative fixed charges of the semiconductor substrate 102 and the diffusion region 105, 123 in that region (depletion layer region) where the depletion layer extends and the total amount of positive fixed charges of the epitaxial layer 103 should become small.

It is however difficult to properly keep the charge balance among the semiconductor substrate 102, the epitaxial layer 103 and the diffusion region 105, 123 of the MOSFET 101, 121 having the double RESURF structure.

For example, the thickness of the epitaxial layer 103 between the semiconductor substrate 102 and the diffusion region 105, 123 depends on the diffusion depth of the diffusion region 105, 123. This makes it extremely difficult to design a semiconductor device in such a way as to properly keep the charge balance. Therefore, it is difficult to properly keep the charge balance among the semiconductor substrate 102, the epitaxial layer 103 and the diffusion region 105, 123.

Also high-precision process control is required in the fabrication process for forming each semiconductor region. This makes it difficult to stably produce high withstand voltage ICs having a predetermined withstand voltage with a high yield, thus lowering the productivity of high withstand voltage ICs.

By the way, an MOSFET which has a so-called single RESURF structure where a RESURF region comprised of the diffusion region 105, 123 is not formed involves fewer fabrication processes that requires high-precision process control than an MOSFET which has the double RESURF structure. In other words, the MOSFET having the single RESURF structure has an advantage of a higher productivity over the MOSFET having the double RESURF structure. However, the single RESURF structure has a shortcoming that it is difficult to realize a high withstand voltage, as compared with the double RESURF structure.

In this respect, studies are made on a high withstand voltage IC which makes good use of the merits of the double RESURF structure and the single RESURF structure.

For instance, studies are made on the formation of a p-channel MOSFET having a double RESURF structure and an n-channel MOSFET having a single RESURF structure at a single semiconductor substrate in case where a high withstand voltage IC needs a p-channel MOSFET with a high withstand voltage.

Because of the following reason, however, a p-channel MOSFET having a double RESURF structure and an n-channel MOSFET having a single RESURF structure could not be formed at a single semiconductor substrate.

An n-channel MOSFET and a p-channel MOSFET are formed by a common p$^-$-type semiconductor substrate and a common n$^-$-type epitaxial layer.

If the impurity concentrations of the p$^-$-type semiconductor substrate and the n$^-$-type epitaxial layer are so set as to achieve the charge balance required of an n-channel MOSFET having a relatively high withstand voltage, therefore, the charge balance in the double RESURF structure of the p-channel MOSFET is lost.

Due to the above reason, the single RESURF structure that would not need high-precision process control so much and the double RESURF structure that would be able to achieve a high withstand voltage could not be formed at a single semiconductor substrate.

The invention has been made in consideration of the problem and aims at providing a semiconductor device suitable for a high withstand voltage IC which has high voltage withstandability and high productivity.

The invention also aims at providing a semiconductor device having a double RESURF structure which is suitable for a case where it is formed together with a semiconductor device having a single RESURF structure at a single semiconductor substrate.

Further, the invention aims at providing a semiconductor device having a double RESURF structure which can be formed together with a semiconductor device having a single RESURF structure at a single semiconductor substrate without losing the charge balance.

DISCLOSURE OF INVENTION

To achieve the objects, a semiconductor device according to the invention is characterized by comprising:

a first semiconductor region (2) comprised of a semiconductor region of a first conductivity type;

a second semiconductor region (3) formed at one major surface of the first semiconductor region (2) and comprised of a semiconductor region of a second conductivity type;

a third semiconductor region (5, 43) formed at a predetermined surface region of the second semiconductor region (3) and comprised of a semiconductor region of the first conductivity type; and a fourth semiconductor region (9, 42) formed near an interface between the first semiconductor region (2) and the second semiconductor region (3) in such a way as to face at least a part of the third semiconductor region (5, 43) via the second semiconductor region, and comprised of a semiconductor region of the second conductivity type which has a higher impurity concentration than an impurity concentration of the second semiconductor region (3).

With the structure, the semiconductor device has a so-called double RESURF structure where the second semiconductor region is formed at one major surface of the first semiconductor region and the third semiconductor region is formed at a predetermined surface region of the second semiconductor region. As the fourth semiconductor region is formed near the interface between the first semiconductor region and the second semiconductor region, when a voltage is applied, depletion layers respectively extend from a pn junction formed at the interface between the first semiconductor region and the second semiconductor region, from a pn junction formed at the interface between the second semiconductor region and the third semiconductor region, and further from a pn junction formed at the interface between the first semiconductor region and the fourth semiconductor region. When the applied voltage reaches a predetermined voltage value, the depletion layers that extend from those interfaces become contiguous to one another, so that the depletion layer extends substantially all over the second semiconductor region, the third semiconductor region and the fourth semiconductor region. This fixes the potential.

Even when a semiconductor device having such a double RESURF structure and a semiconductor device having a single RESURF structure are formed at a single semiconductor substrate, the charge balance of the semiconductor device that has the double RESURF structure is not substantially lost. The fourth semiconductor region has a higher impurity concentration than the second semiconductor region. Accordingly, the impurity concentration of the second semiconductor region appears to increase, so that the difference between the total amount of the fixed charges of the first semiconductor region and the third semiconductor region and the total amount of the fixed charges of the second semiconductor region and the fourth semiconductor region becomes small. This can prevent the charge balance from being lost.

It is preferable that the fourth semiconductor region (9, 42) should be formed in such a way as to have an outer periphery positioned inward of an outer periphery of the third semiconductor region (5, 43).

Particularly, it is preferable that the fourth semiconductor region (9, 42) is formed in such a way as to have an outer periphery positioned near a center of the third semiconductor region (5, 43).

The second semiconductor region (3) is formed by epitaxial growth.

BEST MODE FOR CARRYING OUT THE INVENTION

A description will be given of the invention as adapted to a p-channel MOSFET (Metal Oxide Semiconductor Field Effect Transistor) of a high withstand voltage IC (Integrated Circuit) as an example.

A p-channel MOSFET having a double RESURF structure and an n-channel MOSFET having a single RESURF structure, both of which constitute a high withstand voltage IC, are formed at a single semiconductor substrate.

Figure 1:
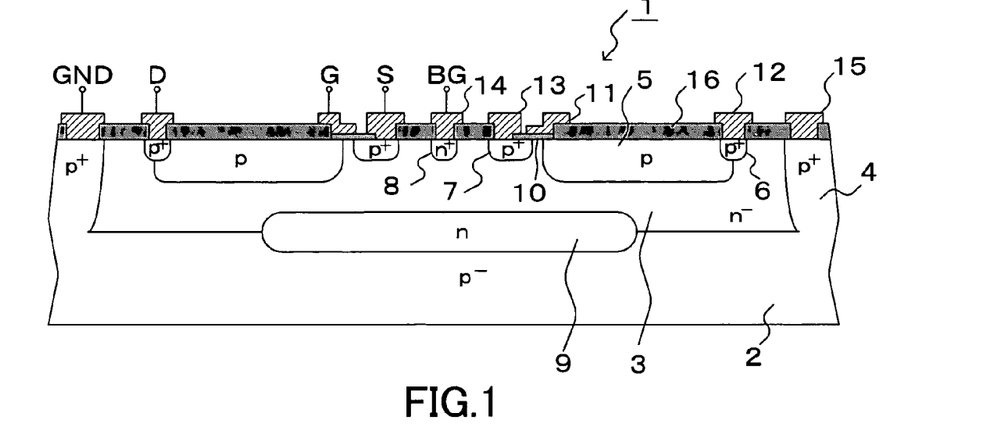
FIG. 1 is a cross-sectional view of a p-channel MOSFET according to an embodiment of the present invention.
Figure 2:
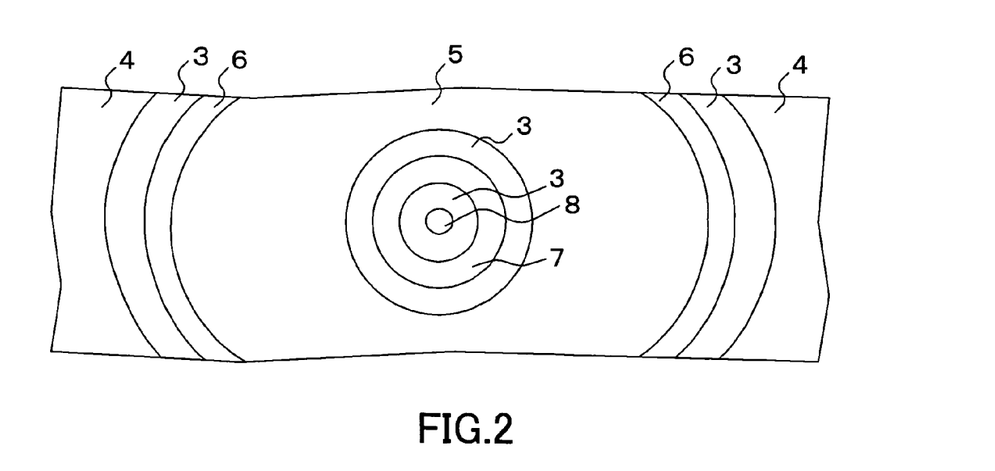
FIG. 2 is a plan view of the p-channel MOSFET according to the embodiment of the present invention.

FIG. 1 shows a cross-sectional view of a p-channel MOSFET, and FIG. 2 shows a cross-sectional view of an n-channel MOSFET. FIG. 2 shows a state where an insulating layer and an electrode are not formed.

As shown in FIG. 1, a p-channel MOSFET 1 has a substrate (first semiconductor region) 2, an epitaxial layer (second semiconductor region) 3, a diffusion isolation layer 4, a diffusion region 5 as a third semiconductor region, a drain contact region 6, a source region 7, a back gate region 8, a buried layer (fourth semiconductor region) 9, a gate insulating layer 10, a gate electrode 11, a drain electrode 12, a source electrode 13, a back gate electrode 14, a ground electrode 15, and a field insulating layer 16.

The substrate 2 is comprised of a p⁻-type semiconductor substrate doped with a p-type (first conductivity type) impurity. The thickness of the substrate 2 is about 300 μm to 400 μm.

The epitaxial layer 3 is formed at one major surface, for example, the top surface, of the substrate 2. The epitaxial layer 3 has a drain drift region where the drain current flows sideways in FIG. 1. The epitaxial layer 3 is comprised of an n⁻-type semiconductor layer doped with an n-type (second conductivity type) impurity. The epitaxial layer 3 is formed by epitaxially growing an n⁻-type semiconductor layer on the substrate 2. The thickness of the epitaxial layer 3 is about 3.5 μm to 20 μm.

Here, the impurity concentrations of the substrate 2 and the epitaxial layer 3 are set to the concentrations that can properly achieve the electric field relaxing effect by a single RESURF structure to be discussed later. Specifically, the impurity concentrations of the substrate 2 and the epitaxial layer 3 are set in such a way that the amount of fixed charges of the substrate 2 in the depletion layer region which extends from the pn junction formed at the interface between the substrate 2 and the epitaxial layer 3 becomes substantially equal to the amount of fixed charges of the epitaxial layer 3 (or the difference between them becomes small).

In the embodiment, the impurity concentration of the substrate 2 is set to about $2.7 \times 10^{14}$ cm⁻³ to $2.6 \times 10^{15}$ cm⁻³, and the impurity concentration of the epitaxial layer 3 is set to about $5.6 \times 10^{14}$ cm⁻³ to $4.9 \times 10^{15}$ cm⁻³.

The diffusion isolation layer 4 is formed at the top surface of the substrate 2. The diffusion isolation layer 4 is formed in, for example, a ring shape as shown in FIG. 2 in such a way as to surround the epitaxial layer 3. The diffusion isolation layer 4 is comprised of a p⁺-type semiconductor layer doped with a p-type impurity. The diffusion isolation layer 4 electrically isolates the p-channel MOSFET 1 from another semiconductor device (e.g., an n-channel MOSFET) by pn junction isolation. The diffusion isolation layer 4 has an impurity concentration of about $1 \times 10^{16}$ cm⁻³ to $1 \times 10^{20}$ cm⁻³ and a thickness of about 3.5 μm to 20 μm.

The diffusion region 5 is formed at a predetermined region of the top surface of the epitaxial layer 3, in, for example, a ring-like region shown in FIG. 2. The diffusion region 5 is comprised of a p-type semiconductor region doped with a p-type impurity. The diffusion region 5 has an impurity concentration of about $1.1 \times 10^{16}$ cm⁻³ to $6.9 \times 10^{16}$ cm⁻³ and a thickness of about 0.8 μm to 3.4 μm. The diffusion region 5, together with the substrate 2 and the epitaxial layer 3, forms a double RESURF structure. The diffusion region 5 also functions as the drain drift region. This is because the drain current flows in the diffusion region 5.

The drain contact region 6 is formed, adjacent to the outer periphery of the diffusion region 5, at the top surface of the epitaxial layer 3. In the embodiment, as the diffusion region 5 is formed in a ring-like shape, the drain contact region 6 is also formed in a ring-like shape. The drain contact region 6 is comprised of a p⁺-type semiconductor region doped with a p-type impurity. The drain contact region 6 has an impurity concentration of about $1 \times 10^{18}$ cm⁻³ to $1 \times 10^{20}$ cm⁻³ and a thickness of about 0.3 μm to 4 μm.

The source region 7 is formed at a predetermined region of the top surface of the epitaxial layer 3, inward of the diffusion region 5, in, for example, a ring-like region as shown in FIG. 2. The source region 7 is comprised of a p⁺-type semiconductor region doped with a p-type impurity. The source region 7 has an impurity concentration of about $1 \times 10^{18}$ cm⁻³ to $1 \times 10^{20}$ cm⁻³ and a thickness of about 0.3 μm to 4 μm.

The back gate region 8 is formed at a predetermined region of the top surface of the epitaxial layer 3, inward of the source region 7. The back gate region 8 is comprised of an n⁺-type semiconductor region doped with an n-type impurity. The back gate region 8 has an impurity concentration of about $1 \times 10^{18}$ cm⁻³ to $1 \times 10^{20}$ cm⁻³ and a thickness of about 0.3 μm to 10 μm.

The buried layer 9 is formed in the vicinity of the interface between the substrate 2 and the epitaxial layer 3. The vicinity of the interface surface between the substrate 2 and the epitaxial layer 3 means the interface between the substrate 2 and the epitaxial layer 3 and in the vicinity of the interface. In the embodiment, the buried layer 9 is formed at the interface between the substrate 2 and the epitaxial layer 3.

The buried layer 9 is comprised of a semiconductor layer doped with an impurity of the same conductivity type (n-type) as that of the epitaxial layer 3. The buried layer 9 has a portion formed by diffusion of the impurity into the substrate 2 from the interface between the substrate 2 and the epitaxial layer 3 and a portion formed by diffusion of the impurity into the epitaxial layer 3 from that interface. The thickness of the buried layer 9 is about 2 μm to 15 μm.

The impurity concentration of the buried layer 9 is set higher than the impurity concentration of the epitaxial layer 3 in such a way that the impurity concentration of the epitaxial layer 3 appears to increase. In the embodiment, the impurity concentration of the buried layer 9 is set to about $2 \times 10^{17}$ cm⁻³ to $1 \times 10^{19}$ cm⁻³.

The region for forming the buried layer 9 is set in such a way that the buried layer 9 faces the diffusion region 5, the source region 7 and the back gate region 8 which constitute the double RESURF structure. In the embodiment, as the diffusion region 5 is laid out in such a way as to surround the source region 7 annularly, the planar shape of the buried layer 9 is circular. As the buried layer 9 is formed at the interface between the substrate 2 and the epitaxial layer 3, the epitaxial layer 3 is present between the buried layer 9 and the diffusion region 5, the source region 7 and the back gate region 8.

It is preferable that the buried layer 9 should be formed in such a way that its outer periphery is positioned inward of the outer periphery of the diffusion region 5. This is because if the outer periphery of the buried layer 9 is positioned outside the outer periphery of the diffusion region 5, the charge balance of that portion of the epitaxial layer 3 which lies outside the diffusion region 5 may be lost.

In the embodiment, the buried layer 9 is formed from the center of the epitaxial layer 3 to a position which is approximately a half position between the inner periphery and the outer periphery of the diffusion region 5. Accordingly, that region of the diffusion region 5 which is located outward of the approximately half position (a region closer to the drain contact region 6) does not face the buried layer 9.

The gate insulating layer 10 is formed on the epitaxial layer 3 in such a way as to face the vicinity of the surface (channel forming region) of the epitaxial layer 3 sandwiched between the diffusion region 5 and the source region 7. The gate insulating layer 10 is formed by, for example, a silicon oxide layer.

The gate electrode 11 is formed on the gate insulating layer 10. The gate electrode 11 is comprised of a conductive layer of polysilicon, metal or the like and is formed by CVD (Chemical Vapor Deposition) or so. As a predetermined voltage (gate voltage) is applied to the gate electrode 11, a channel is formed the vicinity of the surface of the epitaxial layer 3.

The drain electrode 12 is formed on the drain contact region 6 and is electrically connected to the drain contact region 6. The source electrode 13 is formed on the source region 7 and is electrically connected to the source region 7. The back gate electrode 14 is formed on the back gate region 8 and is electrically connected to the back gate region 8. The ground electrode 15 is formed on the diffusion isolation layer 4 and is electrically connected to the diffusion isolation layer 4. The field insulating layer 16 is formed on the epitaxial layer 3. The field insulating layer 16 is formed by, for example, a silicon oxide layer.

The p-channel MOSFET 1 constructed as discussed above, when seen planarly with the insulating layers 10 and 16 and the electrodes 11 to 15 unformed, is as shown in FIG. 2. Specifically, the back gate region 8 is located at the center, and the epitaxial layer 3, the source region 7, the epitaxial layer 3, the diffusion region 5, the drain contact region 6, the epitaxial layer 3 and the diffusion isolation layer 4 are formed in order in such a way as to surround around the back gate region 8.

In the p-channel MOSFET 1, the buried layer 9 formed at the interface between the substrate 2 and the epitaxial layer 3 constitutes the double RESURF structure too. That is, the p-channel MOSFET 1 has the double RESURF structure that is constructed by the substrate 2, the epitaxial layer 3, the diffusion region 5 and the buried layer 9.

Figure 3:
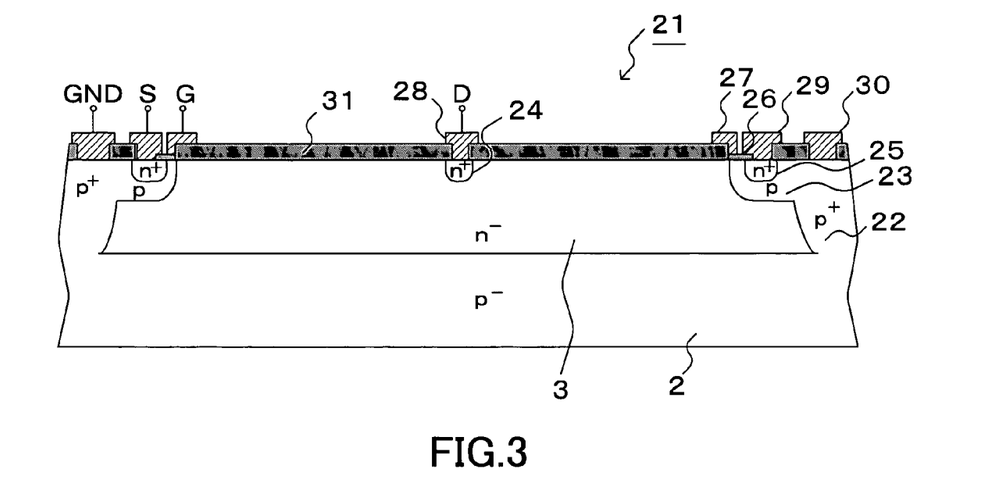
FIG. 3 is a cross-sectional view of an n-channel MOSFET which constitutes a high withstand voltage IC.

Next, a description will be given of an n-channel MOSFET which, together with the thus-constructed p-channel MOSFET, constitutes a high withstand voltage IC. FIG. 3 shows a cross-sectional view of an n-channel MOSFET.

As shown in FIG. 3, an n-channel MOSFET 21 has the substrate 2, the epitaxial layer 3, a diffusion isolation layer 22, a diffusion region 23, a drain contact region 24, a source region 25, a gate insulating layer 26, a gate electrode 27, a drain electrode 28, a source electrode 29, a ground electrode 30, and a field insulating layer 31.

The substrate 2 and the epitaxial layer 3 are common to the aforementioned p-channel MOSFET 1.

The diffusion isolation layer 22 is formed at the top surface of the substrate 2. The diffusion isolation layer 22 is formed in, for example, a ring shape in such a way as to surround the epitaxial layer 3. The diffusion isolation layer 22 is comprised of a $p^+$-type semiconductor layer doped with a p-type (first conductivity type) impurity. The diffusion isolation layer 22 electrically isolates the n-channel MOSFET 21 from another semiconductor device (e.g., a p-channel MOSFET) by pn junction isolation.

The diffusion region 23 is formed between the epitaxial layer 3 and the diffusion isolation layer 22. The diffusion region 23 is formed in, for example, a ring-like shape in such a way as to surround the epitaxial layer 3. The diffusion region 5 is comprised of a p-type semiconductor region doped with a p-type impurity.

The drain contact region 24 is formed at a predetermined region on the epitaxial layer 3, e.g., nearly the center of the top surface of the epitaxial layer 3. The drain contact region 24 is comprised of an $n^+$-type semiconductor region doped with an n-type (second conductivity type) impurity.

The source region 25 is formed at the top surface of the diffusion region 23. The source region 25 is formed in, for example, a ring-like shape in such a way as to surround the epitaxial layer 3 with a predetermined distance from the epitaxial layer 3. The source region 25 is comprised of an $n^+$-type semiconductor region doped with an n-type impurity.

The gate insulating layer 26 is formed on the diffusion region 23 in such a way as to face the channel forming region of the diffusion region 23 sandwiched between the epitaxial layer 3 and the source region 25. The gate electrode 27 is formed on the gate insulating layer 26.

The drain electrode 28 is formed on the drain contact region 24 and is electrically connected to the drain contact region 24. The source electrode 29 is formed on the source region 25 and is electrically connected to the source region 25. The ground electrode 30 is formed on the diffusion isolation layer 22 and is electrically connected to the diffusion isolation layer 22. The field insulating layer 31 is formed on the epitaxial layer 3. The field insulating layer 31 is formed by, for example, a silicon oxide layer.

As the n-channel MOSFET 21 constructed as discussed above is seen planarly with the insulating layers 26 and 31 and the electrodes 27 to 30 unformed, the drain contact region 24 is located at the center, and the epitaxial layer 3, the diffusion region 23, the source region 25, the diffusion region 23 and the diffusion isolation layer 22 are formed in order in such a way as to surround the outer periphery of the drain contact region 24.

The n-channel MOSFET 21 has a so-called single RESURF structure where a p-type diffusion region which constitutes a RESURF structure is formed at the top surface of the epitaxial layer 3. When the voltage between the source electrode 29 and the drain electrode 28 reaches a predetermined voltage value, therefore, the electric field is relaxed by the depletion layer that extends from the pn junction formed at the interface between the substrate 2 and the epitaxial layer 3. This achieves a high withstand voltage.

The action of the p-channel MOSFET 1 will be explained next.

In the p-channel MOSFET 1, when a voltage is applied between the source electrode 13 and the drain electrode 12, depletion layers extend respectively from the pn junction formed at the interface between the substrate 2 and the epitaxial layer 3, the pn junction formed at the interface between the substrate 2 and the buried layer 9 and the pn junction formed at the interface between the epitaxial layer 3 and the diffusion region 5.

When the voltage between the source electrode 13 and the drain electrode 12 reaches a predetermined voltage value, the depletion layers extending from those interfaces are connected together. Accordingly, the depletion layer extends substantially all over the epitaxial layer 3, the diffusion region 5 and the buried layer 9, thus fixing the potential.

By the way, to properly keep the charge balance in the double RESURF structure, it is preferable that when the voltage between the source electrode 13 and the drain electrode 12 reaches a predetermined voltage value, the difference between the total amount of negative fixed charges of the substrate 2 and the diffusion region 5 and the total amount of positive fixed charges of the epitaxial layer 3 in the region where the depletion layer extends (depletion layer region) should become small.

The substrate 2 and the epitaxial layer 3 common to the n-channel MOSFET 21 are used in the p-channel MOSFET 1. The impurity concentrations of the substrate 2 and the epitaxial layer 3 are set in such a way as to properly achieve the electric field relaxing effect by the single RESURF structure of the n-channel MOSFET 21.

In general, when the impurity concentrations of the substrate 2 and the epitaxial layer 3 are set in such a way as to properly achieve the electric field relaxing effect by the single RESURF structure of the n-channel MOSFET 21, the impurity concentration of the epitaxial layer 3 that constitutes the double RESURF structure becomes lower than the desired impurity concentration. As a result, the amount of the fixed charges of the epitaxial layer 3 in the depletion layer region that constitutes the double RESURF structure becomes relatively smaller. In other words, the total amount of the fixed charges of the substrate 2 and the diffusion region 5 in the depletion layer region becomes greater than the amount of the fixed charges contained in the epitaxial layer 3. Accordingly, the charge balance in the depletion layer region is lost, causing disturbance of the electric field intensity distribution in the depletion layer region, so that an electric field focus point is generated in the depletion layer region.

The p-channel MOSFET 1 has the buried layer 9 formed between the substrate 2 and the epitaxial layer 3 and having a higher impurity concentration than the impurity concentration of the epitaxial layer 3. This makes the impurity concentration of the epitaxial layer 3 appear to increase. In other words, the amount of positive fixed charges contained in the depletion layer becomes greater than that in a case where the buried layer 9 is not formed.

Therefore, the difference between the total amount of negative fixed charges contained in the substrate 2 and the diffusion region 5 and the total amount of positive fixed charges contained in the epitaxial layer 3 and the buried layer 9 is small.

Consequently, the p-channel MOSFET 1 and the n-channel MOSFET 21 can be formed at a single semiconductor substrate without loosing the charge balance. That is, a high withstand voltage IC having high withstandability and high productivity can be formed.

According to the embodiment, as described above, because the buried layer 9 is formed between the substrate 2 and the epitaxial layer 3, the p-channel MOSFET 1 and the n-channel MOSFET 21 can be formed at a single semiconductor substrate without loosing the charge balance. That is, the p-channel MOSFET 1 is suitable to be formed together with the n-channel MOSFET 21 at a single semiconductor substrate. A high withstand voltage IC having high withstandability and high productivity can be formed by using the p-channel MOSFET 1 and the n-channel MOSFET 21.

According to the embodiment, the buried layer 9 is formed in such a way that its outer periphery is positioned inward of the outer periphery of diffusion region 5. This makes it possible to form the p-channel MOSFET 1 and the n-channel MOSFET 21 at a single semiconductor substrate without loosing the charge balance.

The invention is not limited to the above-described embodiment but various modifications and applications are possible. Another embodiment which is adaptable to the invention will be described below.

Figure 4:
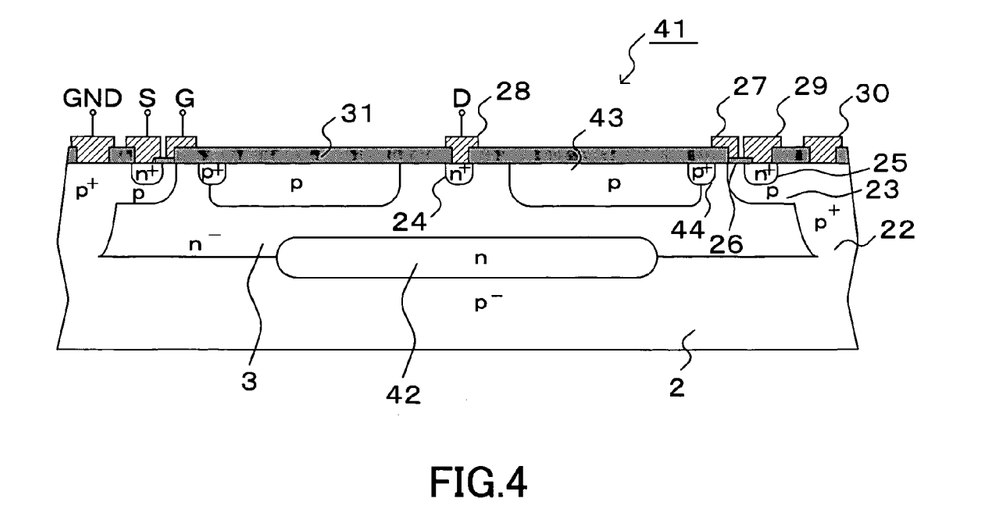
FIG. 4 is a cross-sectional view of an n-channel MOSFET according to another embodiment.

Although a description has been given of the embodiment in case where the invention is adapted to the p-channel MOSFET 1, the invention may be adapted to, for example an n-channel MOSFET. FIG. 4 shows a cross-sectional view of an n-channel MOSFET to which the invention is adapted. In FIG. 4, the same reference symbols are given to the same members of the n-channel MOSFET shown in FIG. 3.

As shown in FIG. 4, a buried layer 42 is formed between the substrate 2 and the epitaxial layer 3 of an n-channel MOSFET 41 having a double RESURF structure. A p-type diffusion region 43 and a $p^+$-type diffusion region 44 are formed at a predetermined region of the top surface of the epitaxial layer 3. This makes it possible to form the n-channel MOSFET 41 and the p-channel MOSFET having a single RESURF structure at a single semiconductor substrate without losing the charge balance.

The epitaxial layer 3 as the drain drift region illustrated in the embodiment may be formed by a method other than epitaxial growth. For instance, the epitaxial layer 3 may be formed by a bonding technology.

The conductivity types illustrated in the embodiment may be reversed to those mentioned above. In other words, the first conductivity type may be an n-type and the second conductivity type may be a p-type. It is to be noted however that the p-channel MOSFET 1 and the n-channel MOSFET 21 have the common substrate 2 and epitaxial layer 3.

In the embodiment, a case where the p-channel MOSFET 1 and the n-channel MOSFET 21 are formed by using a p-type semiconductor substrate for the substrate 2 is illustrated as an example. However, an n-type semiconductor substrate may be used for the substrate 2 to form the p-channel MOSFET 1 and the n-channel MOSFET 21 of the opposite conductivity type.

The invention is based on Japanese Patent Application No. 2002-56566 filed on Mar. 1, 2002, and includes the specification, claims, drawings and abstract of the application. The present specification incorporates what is disclosed in the application entirely by reference.

INDUSTRIAL APPLICABILITY

The invention can be used in an electronic device equipped with a semiconductor device.

The invention claimed is:

1. A semiconductor device characterized by comprising:
a first semiconductor region (2) comprised of a semiconductor region of a first conductivity type and a second semiconductor region (3) formed at one major surface of said first semiconductor region (2) and comprised of a semiconductor region of a second conductivity type for forming a first semiconductor device (1) having a double RESURF structure and a second semiconductor device (21) having a single RESURF structure, wherein said first semiconductor device (1) includes:

a third semiconductor region (5, 43) formed at a predetermined surface region of said second semiconductor region (3) and comprised of a semiconductor region of the first conductivity type; and a fourth semiconductor region (9, 42) formed near an interface between said first semiconductor region (2) and said second semiconductor region (3) in such a way as to face at least a part of said third semiconductor region (5, 43) via said second semiconductor region, and comprised of a semiconductor region of the second conductivity type which has a higher impurity concentration than an impurity concentration of said second semiconductor region (3); and wherein said double RESURF structure of said first semiconductor device (1) is comprised of said first semiconductor region (2), said second semiconductor region (3), said third semiconductor region (5,43) and said fourth semiconductor region (9); and said single RESURF structure of said second semiconductor device (21) is comprised of said first semiconductor region (2) and said second semiconductor region (3).

2. The semiconductor device according to claim 1, characterized in that characterized in that impurity concentrations of said first semiconductor region (2) and said second semiconductor region (3) are set to concentrations at which an electric field can be relaxed by said single RESURE structure.

3. The semiconductor device according to claim 1, characterized in a depletion layer region formed by application of a voltage having a predetermined voltage value to said first semiconductor device (1) a total amount of fixed charges included in said first semiconductor region (2) and said third semiconductor renion (5, 43) is smaller than an amount of fixed charges included in said second semiconductor region (3) or is equal to an amount of fixed charges included in said second semiconductor region (3).

4. The semiconductor device according to claim 3, characterized in that said second semiconductor region (3) is formed by epitaxial growth.

5. The semiconductor device according to claim 1 wherein said fourth semiconductor region (9, 42) is formed so that its planer shape is circular.

6. The semiconductor device according to claim 5, wherein said third semiconductor region is formed so that its planer shape is annular, said fourth semiconductor region (9, 42) faces said third semiconductor region (5, 43), and further, a peripberal portion of said fourth semiconductor region is located radially inward of said third semiconductor region (5, 43).

7. The semiconductor device according to claim 1, wherein said first semiconductor device (1) further comprising:

a fifth semiconductor region (7) formed in the surface region of said second semiconductor region (3); and a first electrode (11) formed, via an insulating layer, on a surface region of said second semiconductor region (3) which is sandwiched by said third semiconductor region (5) and said fifth semiconductor region.

8. The semiconductor device according to claim 7, wherein said second semiconductor device (21) further comprising:

a sixth semiconductor region (22) of the first conductivity type formed so as to extend from the surface region of said second semiconductor region (3) to said first semiconductor region (2);

a seventh semiconductor region (22) of the first conductivity type formed in the surface region of said second semiconductor region (3) so as to contact with said sixth semiconductor region (22);

an eighth semiconductor region (25) of the second conductivity type formed in a surface region of said seventh semiconductor region (23); and a second electrode (27) formed, via an insulating layer, on a surface region of said seventh semiconductor region (23) which is sandwiched by said eighth semiconductor region (23) and said second semiconductor region.

9. The semiconductor device according to claim 8, wherein said second semiconductor device (21) comprises a ground electrode (30) formed on a top surface of said sixth semiconductor region (22).

10. The semiconductor device according to claim 8, wherein said first semiconductor device (41) further comprising:

a ninth semiconductor region (22) formed so as to extend from the surface region of said second semiconductor region (3) to said first semiconductor region (2);

a tenth semiconductor region (23) of the first conductivity type formed on the surface of said semiconductor region (3) so as to contact with said ninth semiconductor region (22); and an eleventh semiconductor region (25) of the second conductivity type formed in a surface region of said tenth semiconductor region (23); and a third electrode (27) formed, via an insulating layer, at a top surface of said seventh semiconductor region (23) which is sandwiched by said eleventh semiconductor region (25) and said second semiconductor region.

11. The semiconductor device according to claim 10, wherein said first semiconductor device (41) comprises a ground electrode formed on a top surface of said ninth semiconductor region (22).

* * * * *

UNITED STATES PATENT AND TRADEMARK OFFICE
CERTIFICATE OF CORRECTION

PATENT NO.       : 7,132,725 B2                                    Page 1 of 1
APPLICATION NO.  : 10/504891
DATED            : November 7, 2006
INVENTOR(S)      : Akio Iwabuchi It is certified that error appears in the above-identified patent and that said Letters Patent is hereby corrected as shown below:

Column 11, line 24, please delete "characterized in that" before the word "impurity."

Column 11, line 27, please delete "RESURE" and insert --RESURF--.

Column 11, line 32, please insert a comma after "(1)."

Column 11, line 34, please delete "renion" and insert --region.--

Signed and Sealed this

Sixth Day of March, 2007

JON W. DUDAS
*Director of the United States Patent and Trademark Office*